United States Patent [19]

Canady et al.

[11] Patent Number: 5,651,868

[45] Date of Patent: Jul. 29, 1997

[54] METHOD AND APPARATUS FOR COATING THIN FILM DATA STORAGE DISKS

[75] Inventors: Mickey Lynn Canady; David Alvoid Edmonson; Gary James Johnson, all of Rochester; Paul David Teig, Byron; Arthur Carl Wall, Rochester, all of Minn.

[73] Assignee: International Business Machines Corporation, Armonk, N.Y.

[21] Appl. No.: 445,969

[22] Filed: May 22, 1995

Related U.S. Application Data

[62] Division of Ser. No. 329,794, Oct. 26, 1994.

[51] Int. Cl.$^6$ ............................. C23C 14/00; C23C 16/00
[52] U.S. Cl. ................. 204/298.25; 204/298.26; 204/298.35; 204/298.15; 204/298.07; 118/50; 118/50.1; 118/719
[58] Field of Search ............................. 118/718, 50, 719, 118/50.1; 204/298.23, 298.24, 298.25, 298.26, 298.35, 298.15, 298.07

[56] References Cited

U.S. PATENT DOCUMENTS

| | | | |
|---|---|---|---|
| 3,294,670 | 12/1966 | Charschan et al. | 204/298.25 |
| 3,322,577 | 5/1967 | Smith | 148/6.3 |
| 3,785,853 | 1/1974 | Kirkman | 427/255.3 |
| 4,048,955 | 9/1977 | Anderson . | |
| 4,322,276 | 3/1982 | Meckel | 204/192 P |
| 4,430,149 | 2/1984 | Berkman | 156/613 |
| 4,500,407 | 2/1985 | Boys | 204/298.12 |
| 4,537,795 | 8/1985 | Nath et al. | 427/4 |
| 4,575,408 | 3/1986 | Bok | 204/192 E |
| 4,596,645 | 6/1986 | Stirn | 204/192 S |
| 4,733,631 | 3/1988 | Boyarsky | 118/719 |
| 4,874,631 | 10/1989 | Jacobson | 427/39 |
| 4,894,133 | 1/1990 | Hedgcoth | 204/192.15 |
| 4,915,622 | 4/1990 | Witmer | 432/64 |
| 4,979,464 | 12/1990 | Kunze-Concewitz et al. | 118/719 |
| 4,981,566 | 1/1991 | Wurczinger | 204/192.13 |
| 5,016,562 | 5/1991 | Madan et al. | 118/719 |
| 5,024,747 | 6/1991 | Turner | 204/298.09 |
| 5,097,794 | 3/1992 | Mahler | 118/719 |
| 5,205,919 | 4/1993 | Zejda | 204/298.25 |
| 5,281,320 | 1/1994 | Turner | 204/298.15 |
| 5,411,592 | 5/1995 | Ovshinsky | 118/719 |
| 5,441,615 | 8/1995 | Mukai | 204/298.07 |

FOREIGN PATENT DOCUMENTS

| | | | |
|---|---|---|---|
| 3036011 A | 4/1981 | Germany | 204/298.25 |
| 58-113374 | 7/1983 | Japan | 204/298.07 |
| 63-303062 | 12/1988 | Japan | 204/298.25 |
| 5-59547 | 3/1993 | Japan | 204/298.25 |

OTHER PUBLICATIONS

Weisweiler et al, Decoupling of processing in coating systems by pumped buffers, Vacuum, vol. 38, No. 8–10, pp. 677–681, 1988 1988.

*Primary Examiner*—Richard Bueker
*Assistant Examiner*—Jeffrie R. Lund
*Attorney, Agent, or Firm*—Matthew J. Bussan; Richard E. Billion; Charles D. Gunter, Jr.

[57] ABSTRACT

A vacuum deposition system is shown in the form of a sputtering system for rigid disk substrates which uses a single vacuum envelope and a single transport to avoid multiple pump downs or valved isolation structures during the multiple coating processes or the transfer of workpieces between conveyer devices. Work stations carried by a modular processing unit provide a slotted opening through which work pieces supported on the transport enter and leave the work station and which affords sufficient restriction to enable a processing gas atmosphere to be maintained within the work station that is above the pressure of the vacuum envelope while being isolated from the adjoining work stations. The work stations are supported on and readily releasable from the modular processing units to allow service and target replacement to occur offline. The work station process steps that are of longest duration are partitioned to be performed at multiple successive work stations to make work station processing times as equal as possible and enhance system throughput.

12 Claims, 10 Drawing Sheets

METHOD AND APPARATUS FOR COATING THIN FILM DATA STORAGE DISKS

This is a divisional of co-pending application Ser. No. 08/329,794 filed on Oct. 26, 1994.

FIELD OF THE INVENTION

The invention is directed to the vacuum coating of workpieces such as data storage disks using a continuous, valveless vacuum vessel for processing.

BACKGROUND OF THE INVENTION

The sputtering process or other deposition process that is performed in near vacuum controlled atmospheres, occurs in a chamber that is first evacuated and thereafter partially pressurized with small amounts of gas to create a minute partial atmosphere of desired composition. Multiple operations are commonly achieved with a single pump down or initial evacuation of a multiple stage, valved chamber by evacuating the chamber initially and then repressurizing to the desired partial atmosphere and reevacuating the chamber during each movement of work between stations as different coatings are applied at successive positions within a single sputtering device.

Typical of such devices is the continuous vapor deposition system of U.S. Pat. No. 5,016,562 wherein a series of modules are separated by valves and each deposition module is preceded and succeeded by an isolation module in addition to the entrance and exit load lock modules. U.S. Pat. No. 4,048,955 illustrates a vapor deposition mechanism wherein a series of processing cells or chambers are separated and isolated by above atmospheric nitrogen seals to exclude the ambient outside atmosphere.

Current rigid disk sputtering machine designs have evolved from semiconductor and thin film head applications with few modifications other than accommodating dual sided deposition. Also, system manufacturers, with limited experience or understanding with respect to thin film disks, have provided machines with overly complex designs in order to accommodate options such as substrate biasing, RF etching and RF sputtering. This complexity adds not only to initial cost, but also adds ongoing maintenance cost and reduced reliability. These sputter system manufacturers attempt to make their machines more versatile to broaden the market base by including features such as isolated process chambers, repetitive pump down to high vacuum and product versatility.

SUMMARY OF THE INVENTION

The present invention uses a valveless mechanism that is inherently more simple and less costly. A modular, but continuous vacuum vessel is used for processing. Differential pumping and gas showers are utilized to isolate the individual process stations with isolation valves used only at load lock stations where parts enter and leave the system. By eliminating chamber isolation valves and incorporating side entry of the load and unload lock stations, the main drive system is greatly simplified to a single continuous transport chain. Transfer of disk substrates from one chain drive to another is eliminated. Since isolation valves are required only at load lock stations, the linear inline configuration of the process vessel allows for modularization and expansion of the system to accommodate additional process steps or altered process steps or techniques and for pre and post sputter operations.

The system includes loading and unloading stations and intermediate modular units each of which includes processing stations and an evacuating pump mechanism. The system provides a continuous evacuated chamber or valveless device that is not partitioned and wherein workpieces are moved from processing station to processing station on a continuous transport device, such as a chain drive on which work carrying pallets are mounted at uniform intervals.

The processing stations are separated from one another by the near vacuum of the evacuated chamber and supplied with process gas to maintain a desired atmosphere and elevated pressure within the respective process chambers. Such processing pressure is an incrementally higher pressure than the intervening evacuated chamber environment, typically a ten to one pressure differential.

The processing chamber assemblies are comprised of two aligned units mounted coaxially at opposite sides of the workpieces carried on the transport to define a slotted opening therebetween through which the workpieces pass to enter and exit the station. Sputter deposition processes have evolved to the point that relatively high process pressures (10 to 40 microns Hg) are routinely employed, while turbomolecular vacuum pumps used to pump down the evacuated chamber obtain maximum throughput at about 1 micron Hg. Accordingly, the required 10 to 1 pressure differential is obtained utilizing the low conductance slits through which the work passes to and from the processing chambers and the gas supply without additional hardware. Further the mean free paths at these process pressures are less than 1 cm, so impurities are not able to diffuse into the process chamber making unnecessary hard valve isolation. Finally, the use of connecting tunnels with gas showers at the top further cleanse the disk substrates and wash impurities in the direction of the pump. Gas emanates from the shower jets with near supersonic velocity and as such has a nonstochastic momentum distribution directed preferentially across the disk surface and toward the pump.

To make a deposition device cost effective for producing products such as coated data storage disks it is important to minimize the complexity and cost of the system. Other measures of cost effectiveness are the throughput and the idle time required for service and target replacement. The single vacuum envelope design is inherently simpler and less costly than the commonly used valved structures for separation of adjoining process stations or the viscous isolation structures that are an alternative. Throughput can be enhanced by partitioning the longer operations among successive workstations to reduce the duration of the longest process time at a single workstation that would determine the overall output of the entire system. Downtime is minimized by the use of work station and load lock assemblies that can be readily released from the modular unit and replaced to enable most service and target replacement to be conducted offline while the system is in operation.

The disk processing system as shown and described contemplates a disk sputtering system that typically applies as consecutive sputtered coatings; an underlayer, a magnetic layer which is commonly a cobalt alloy and a protective, abrasion resistant overcoat such as amorphous carbon. The system could also be used for or in combination with other processes requiring a reduced pressure process atmosphere such as chemical vapor deposition, evaporative coating or sputter etching and would probably include process stations for pre and post sputtering processes such as heating or lubing.

DETAILED DESCRIPTION

Figure 1:
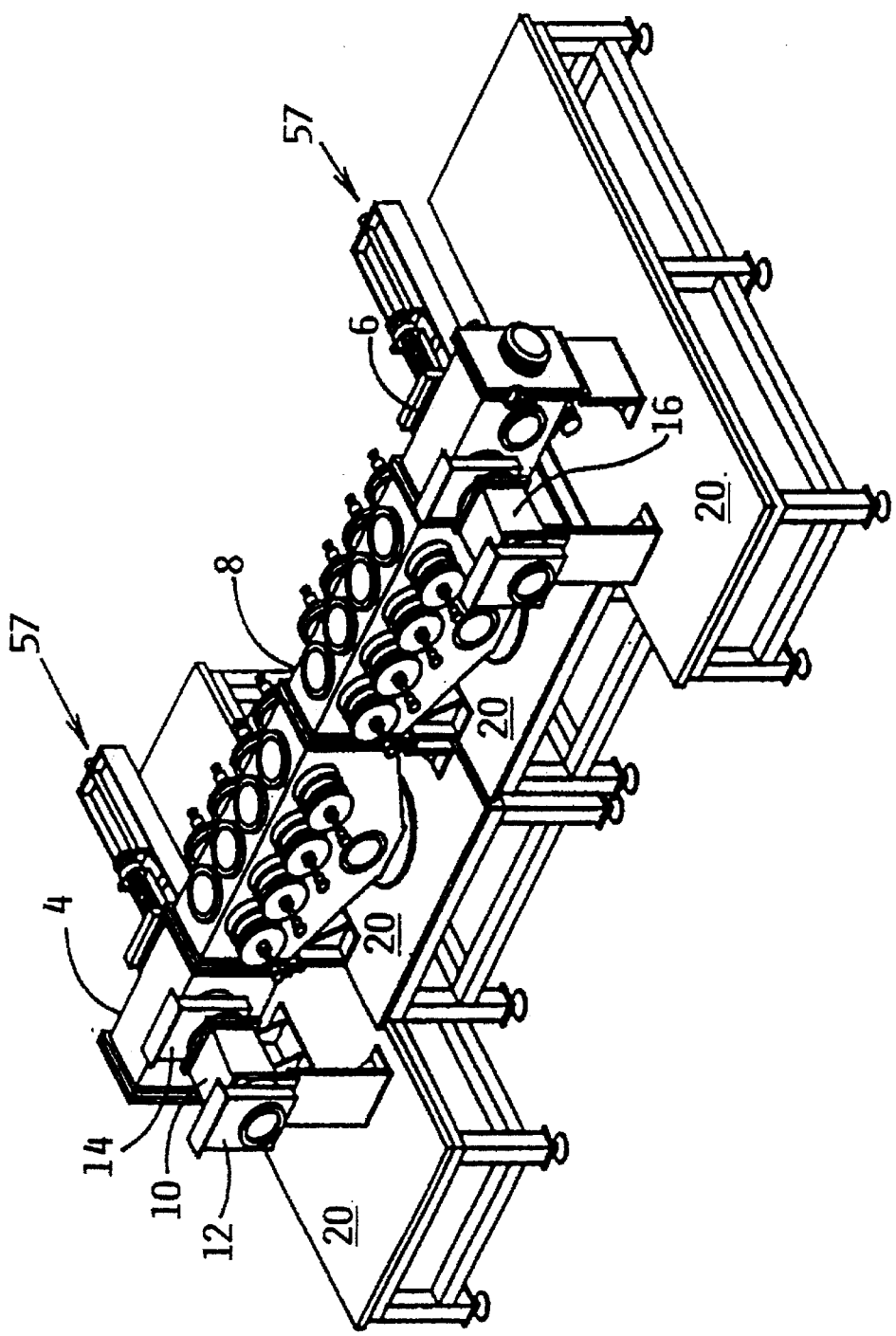
FIG. 1 is an isometric view of the structure of a sputtering system including the present invention.
Figure 2:
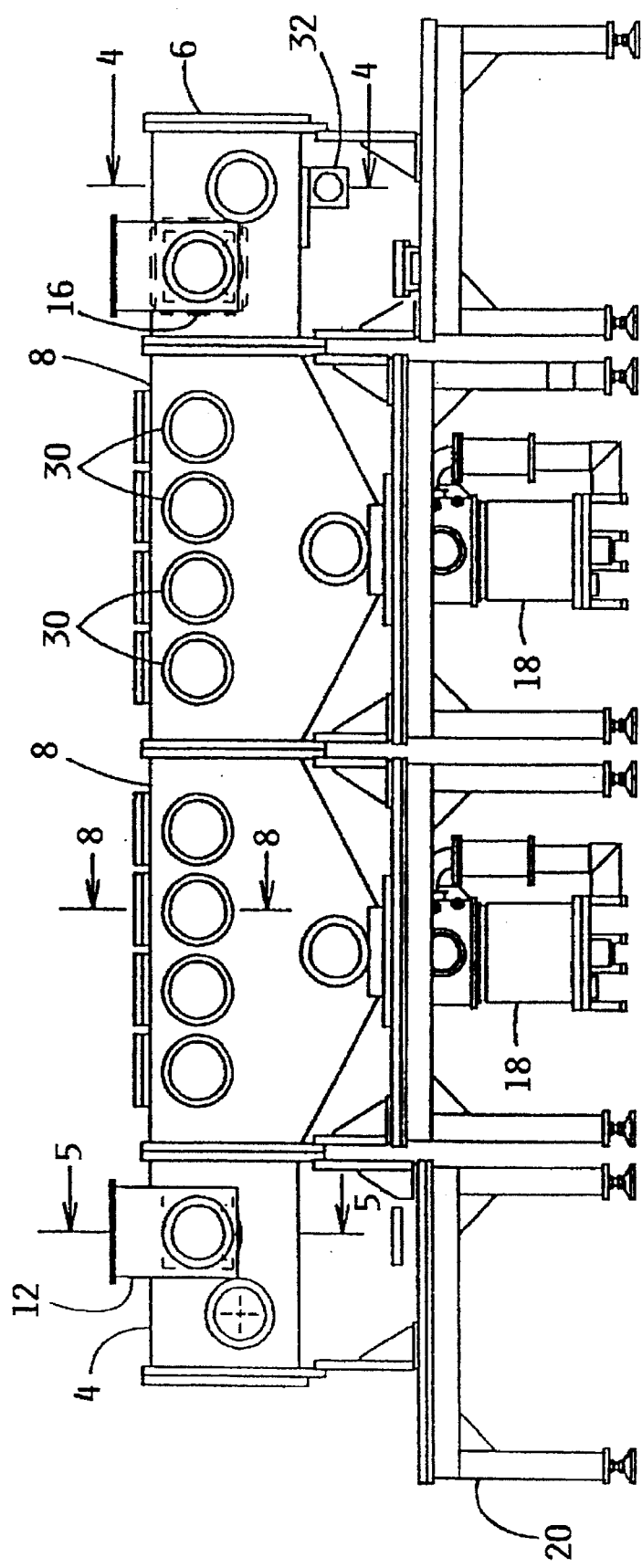
FIGS. 2 and 3 are elevation and plan views respectively of the structure of FIG. 1.
Figure 3:
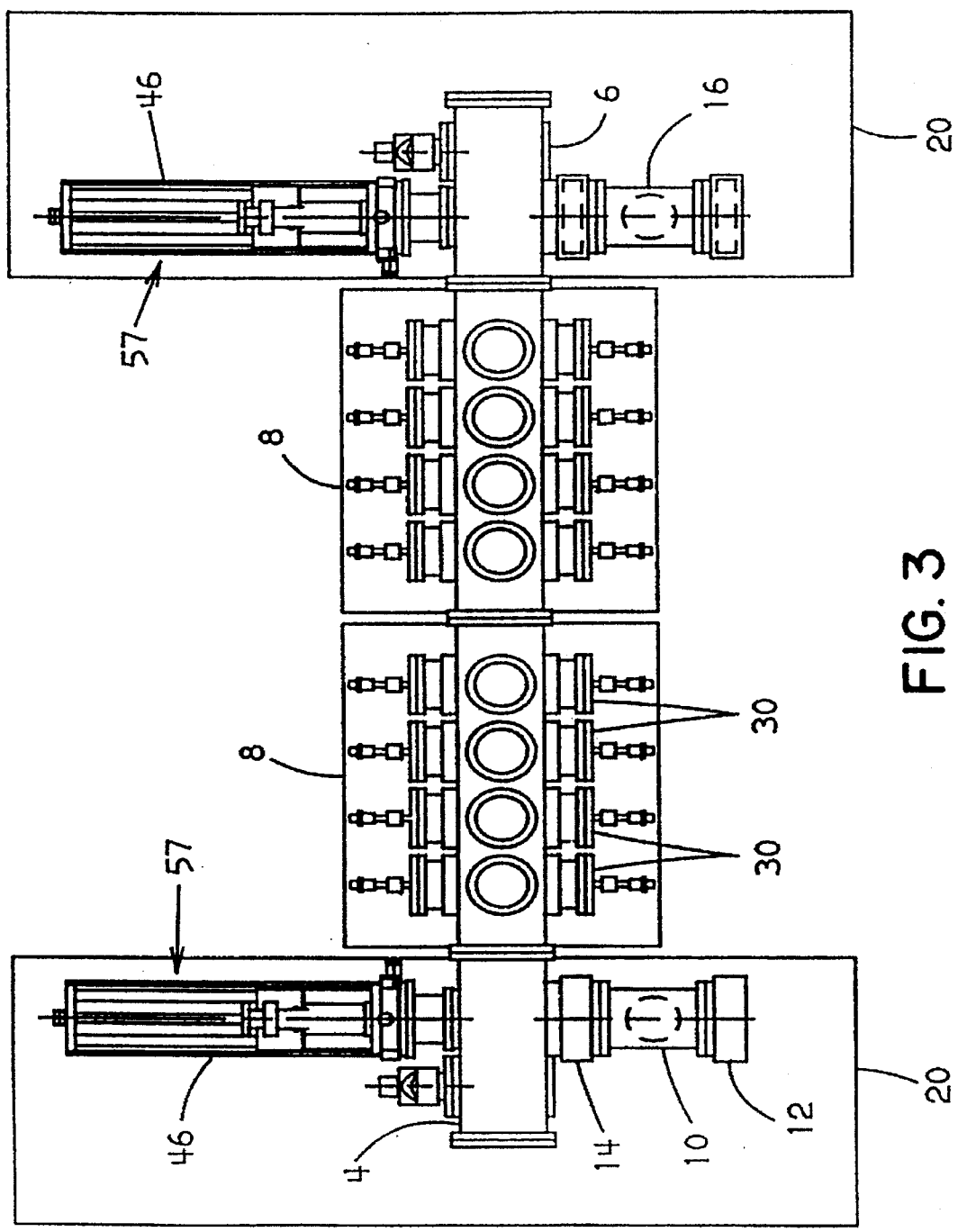

FIGS. 1, 2 and 3 are each a partial view of the sputtering system of the present invention. A pair of terminal housings 4, 6 and the intervening modular process unit or units 8 form a single vacuum envelope or chamber. The parts or workpieces are loaded at a load lock 10 which is isolated by valves 12, 14 and attached to the system through an opening in the terminal housing 4. A similar device removes the workpieces at the load lock 16 mounted on the other terminal housing 6. Each of the modular process vessels 8 includes a turbomolecular vacuum pump 18 which is effective to reduce the vacuum envelope to a pressure of one micron of mercury (Hg). Each of the terminal housings 4, 6 and modular process units 8 are mounted on tables 20 to enable the interchange of units and the use of the number of processing modules required for the specific process.

Figure 4:
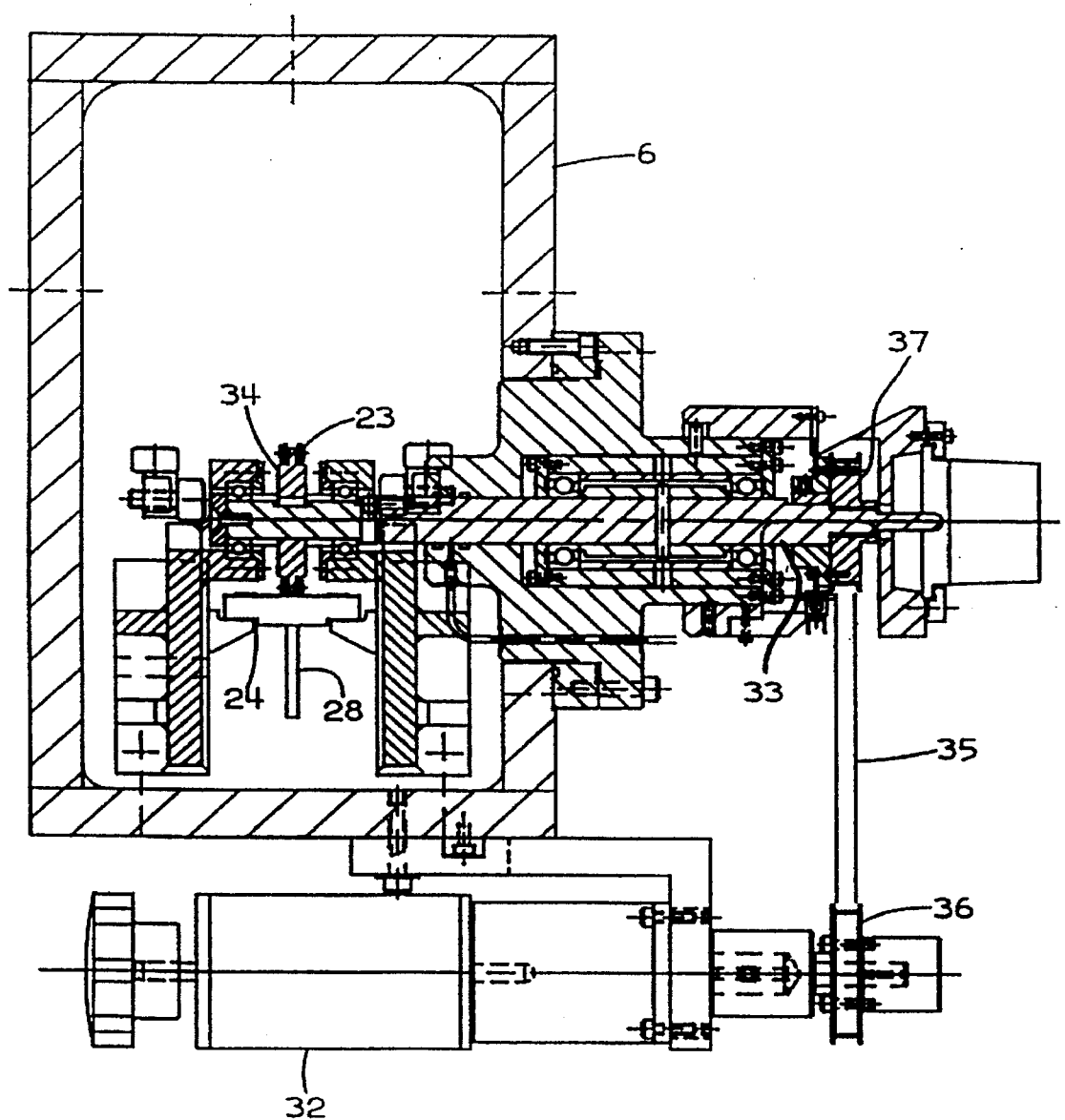
FIG. 4 is a section view taken along line 4—4 of FIG. 2.
Figure 5:
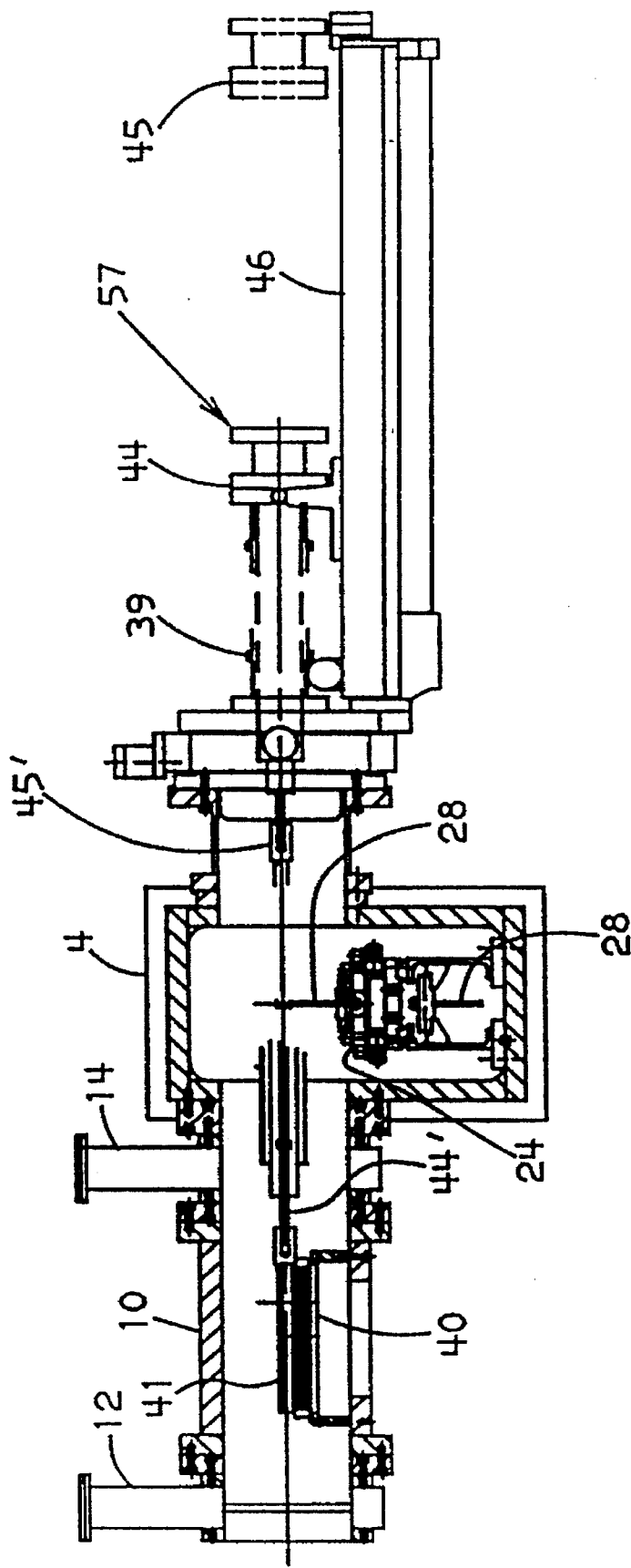
FIG. 5 is a section view taken along line 5—5 of FIG. 2.
Figure 8:
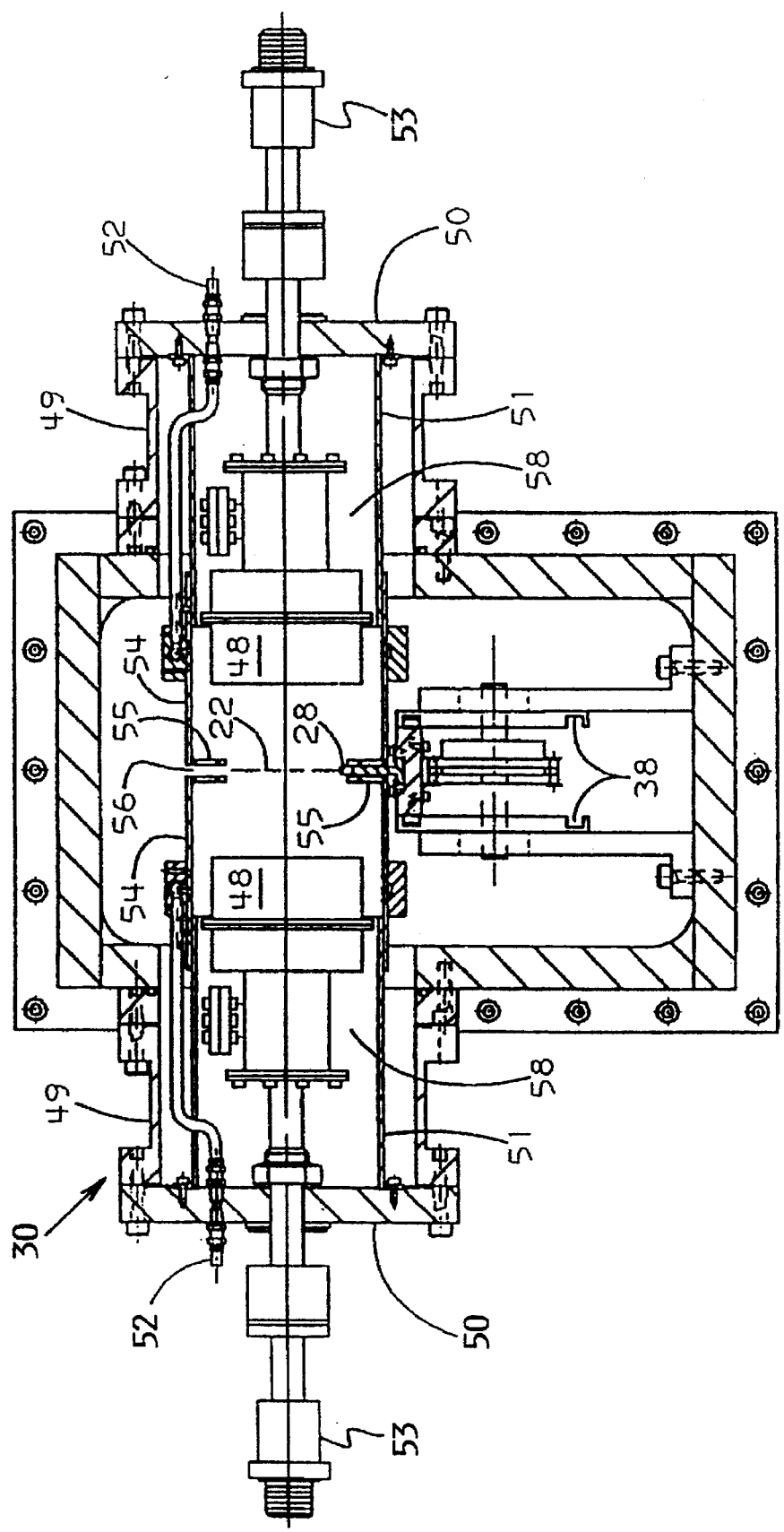
FIG. 8 is a section view taken along line 8—8 of FIG. 2.
Figure 9:
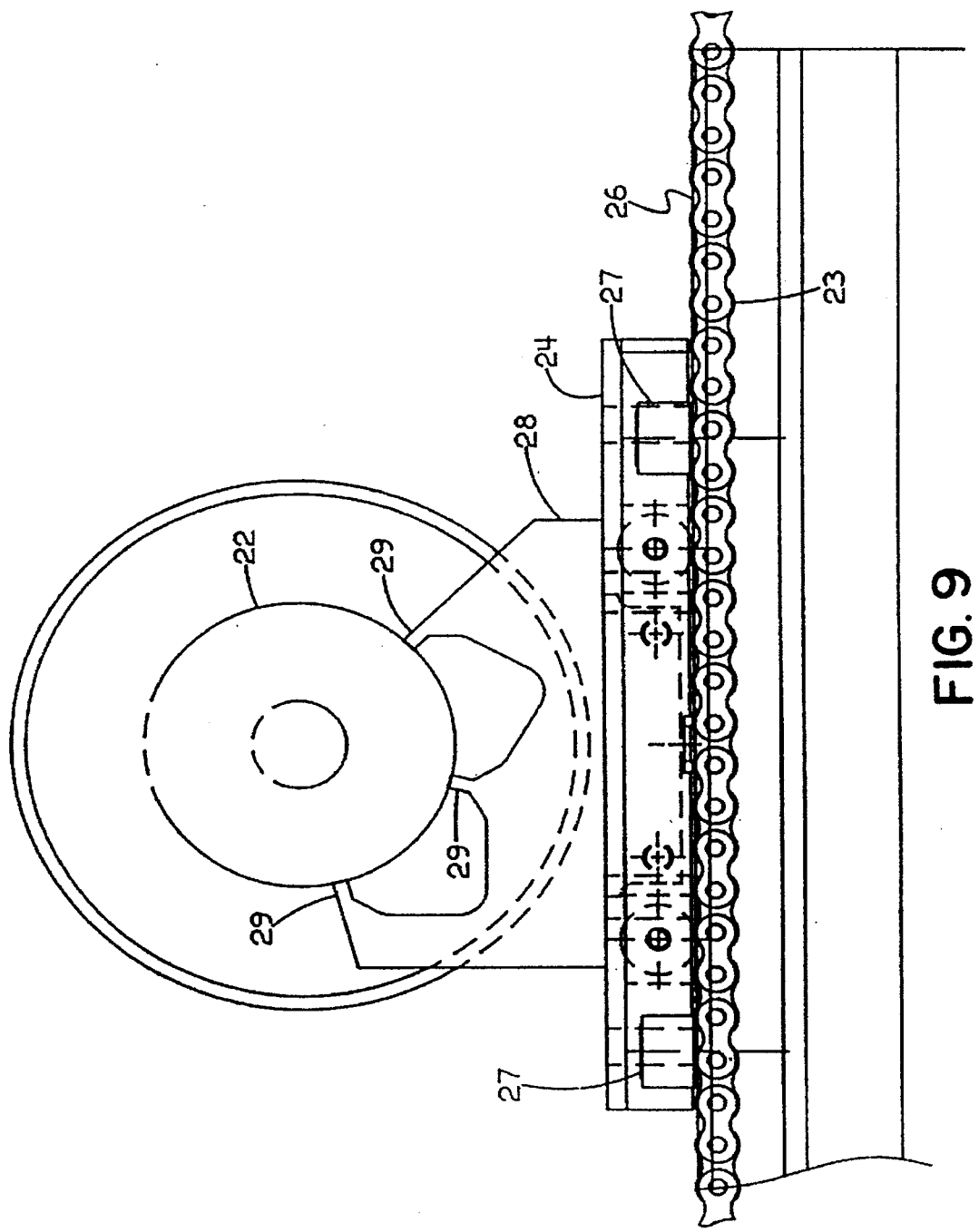
FIGS. 9 and 10 are respectively elevation and plan views of the system transport structure of the invention including the trolley and pallet.
Figure 10:
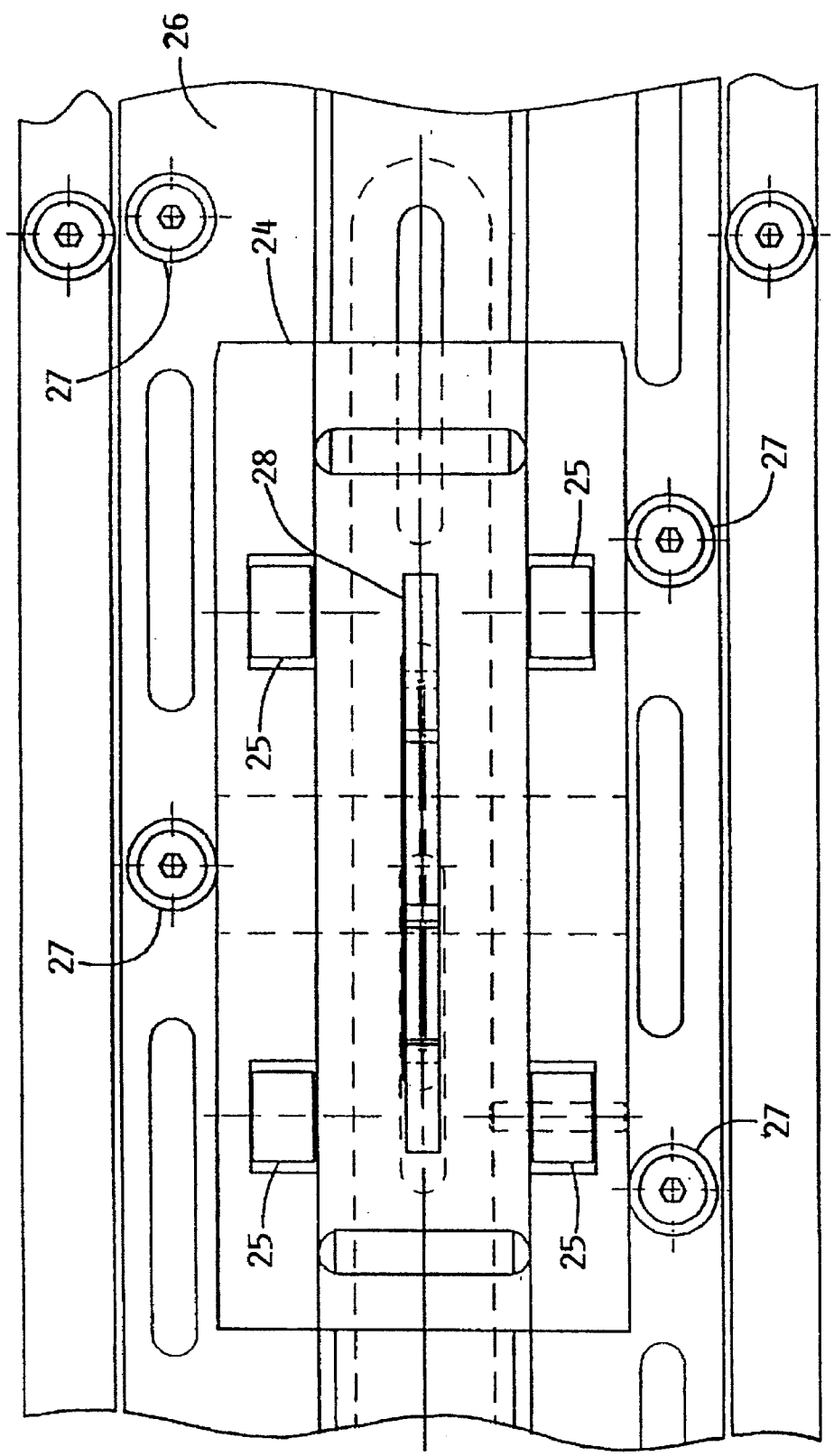
Figure 11:
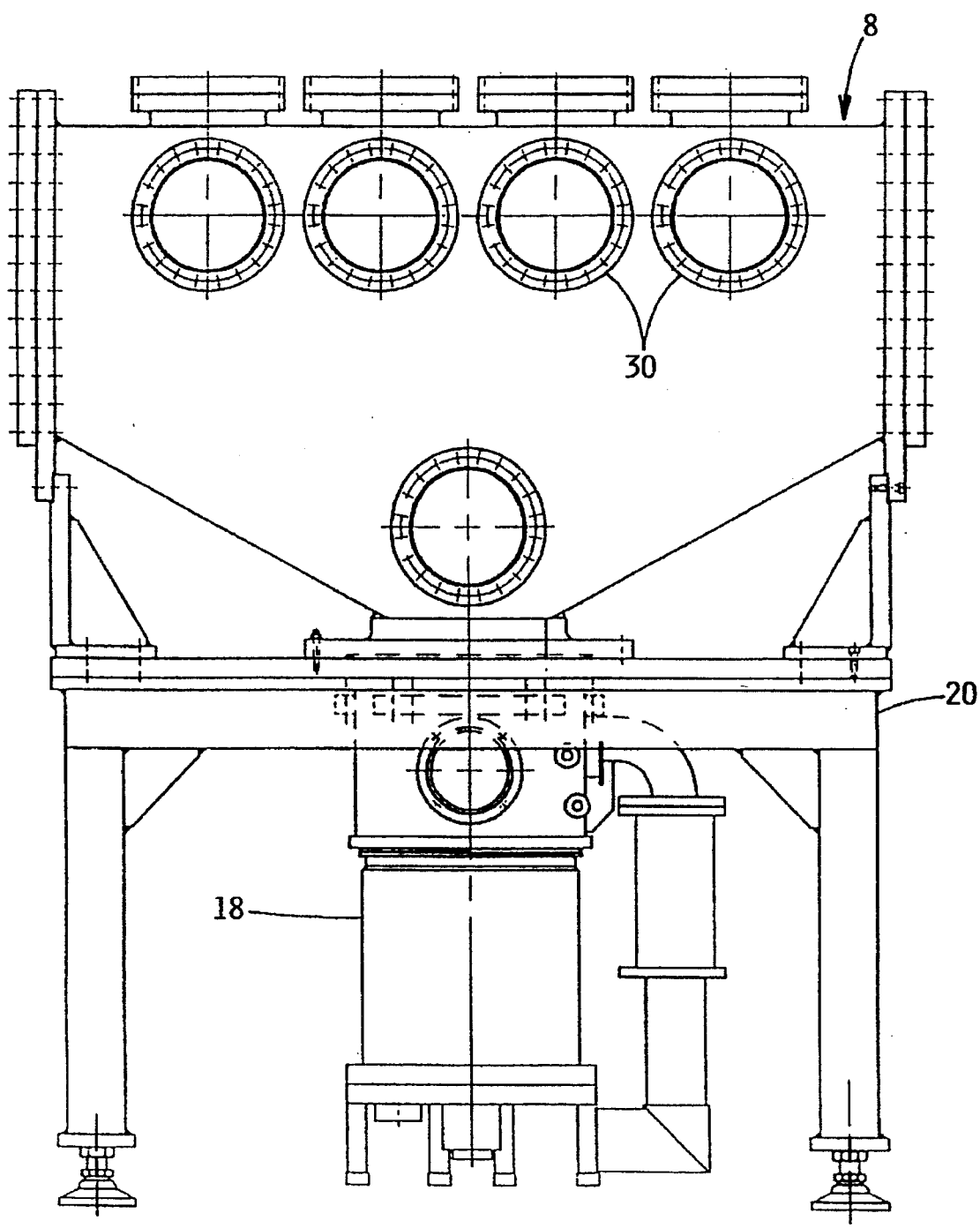
FIG. 11 is an elevation view of a modular processing unit including the vacuum pump.

FIGS. 9 and 10 show the manner in which the disk substrate workpieces 22 are carried past the workstations. A continuous chain drive element 23 is connected to the middle of a trolley 24. The trolley 24 includes a set of four rollers 25 that support the carriage assembly on the bed plate surface 26. Other rollers 27 mounted on the transport support assembly guide trolley 24 to restrain lateral movement. Rigidly attached to trolley 24 is a pallet 28 which presents three grooved projections 29 that receive and support the disk workpiece 22 in a vertical position. The modular unit workstations 30 are uniformly spaced and a like spacing is maintained between adjacent trolleys 24 on the drive chain 23 such that all work stations may function simultaneously as work pieces are moved through a series of indexed positions. Power for the transport mechanism is provided by a motor 32 (FIG. 4) mounted on one of the terminal housings 6. The shaft 33 which rotates in unison with sprocket 34 to move the trolleys 24 is driven by motor 32 through belt 35 and pulleys 36, 37. The trolleys 24 are carried above the chain 23 from the load station in terminal housing 4, through the processing stations 30 of modular units 8 and to the unloading station within the opposite terminal housing 6. The trolleys 24 with the attached unloaded pallets 28 are returned through a lower portion of the vacuum envelope as seen in FIG. 5. Through much of the return travel the trolley margins are confined in grooves 38 (FIG. 8).

Figure 7:
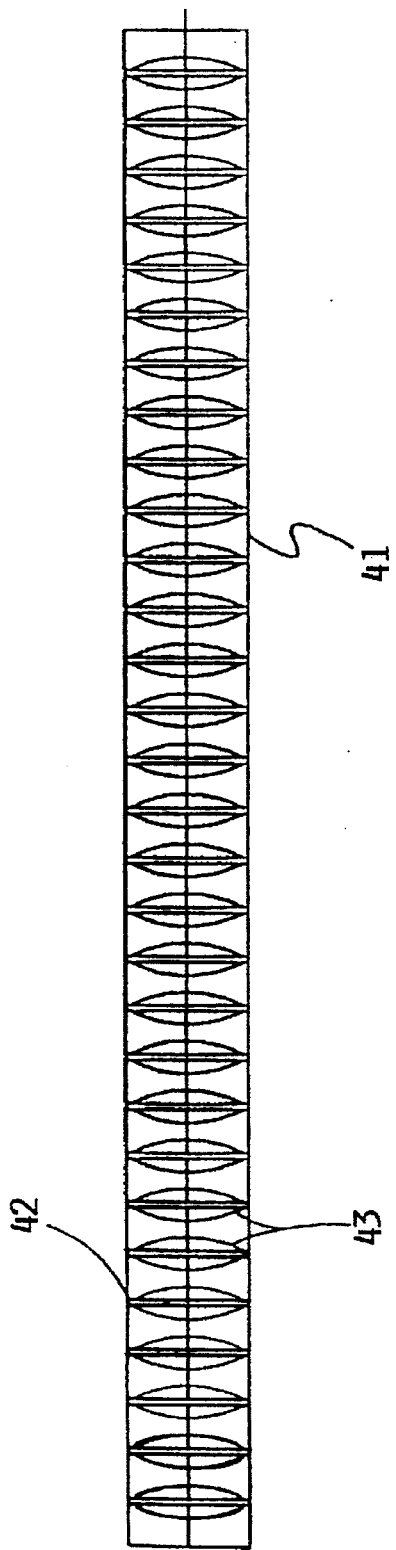
FIGS. 6 and 7 are elevation and plan views respectively of the transfer rods used to load and unload workpieces into and out of the sputtering system.
Figure 6:
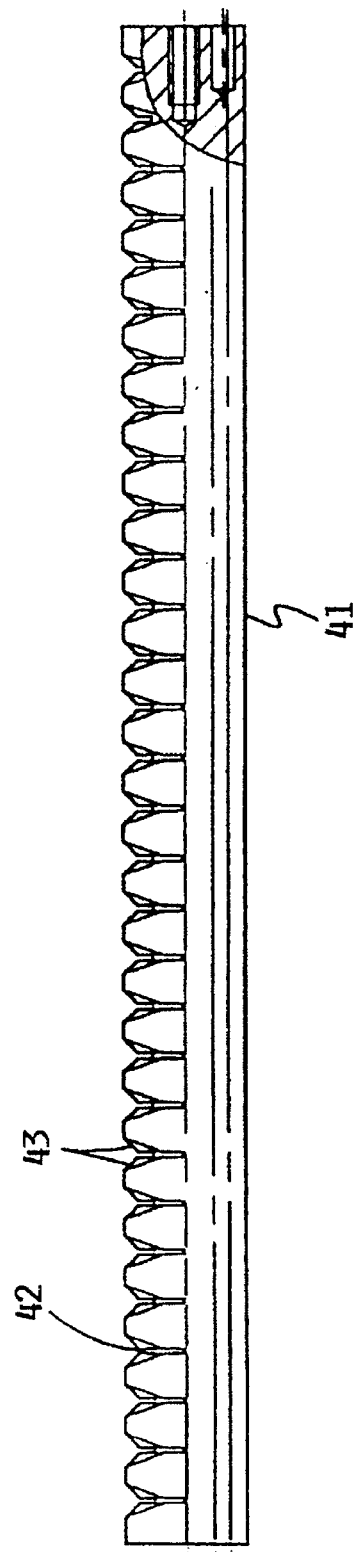

FIGS. 5, 6 and 7 show the loading and unloading mechanism. The load and unload functions are substantially identical with the sequencing being reversed to successively load thirty (30) pallets within one terminal housing and successively unload thirty (30) pallets at the opposite terminal housing. A cassette 40 containing thirty (30) disks is inserted into the load lock 10 by opening valve 12 with valve 14 closed and the transfer mechanism withdrawn to the right (as seen in FIG. 5). With valve 12 closed and valve 14 open, the transport rod 41 is advanced to the position shown in FIG. 5 where the rod extends through the central openings of the disks supported in the cassette 40. As seen in the respective elevation and plan views of FIGS. 6 and 7, the transport rod 41 has thirty (30) grooves 42 with angled guide surfaces 43 at each side of each groove to permit all thirty (30) disks within the cassette to be aligned and picked up simultaneously.

The transfer mechanism 57 is of commercially available design with the principal moving assembly, that moves in unison with the disk transport rod 41, having three degrees of freedom, the X, Y and Z axes as viewed in FIG. 5. The transport mechanism includes a moving portion that slides on a frame 46 and is shrouded by an accordion pleated cover or shroud 39 which encloses a portion exterior of the terminal housing 4. With the rod 41 approximately coaxial with the center openings of the disks supported in cassette 40 within the load lock 10, the transfer mechanism (shown in part) advances from the retracted dotted line position 45, 45' to the advanced solid line position 44, 44'. This aligns the grooves 42 respectively with the disks in the cassette 40. The rod 41 is then lifted upward or elevated in the direction of the Y axis to lift the disks from the cassette 40. Rod 41 with the disks supported thereon is retracted to align the outermost disk on the rod 41 with the next pallet 28 arriving at the loading station. The rod 41 is then lowered and retracted so that the disk is transferred from rod 41 to the pallet and the distal end of the support rod is clear of the disk and pallet at the load station. The transport mechanism may now be indexed to bring the next successive pallet to the load location. The transfer mechanism is then successively advanced to align the next disk from the distal end of the rod with the pallet 28 at the load station, lowered to place the disk in the grooved projections 29 and retracted to allow the transport mechanism to be indexed. This sequence is reversed to sequentially unload the processed disks at the opposite end of the transport and load thirty (30) disks into a cassette supported in the load lock 16 adjacent the unloading site.

Though not shown herein, the transfer mechanism may include optical sensing to make more precise the positioning of the transfer rod within the openings of the disks within the cassette 40 at the load lock and to align the grooves 42 with disks in the cassette 40 and align a disk in a groove 42 with the grooved projections 29 of a pallet 28. At the unloading site the selected groove 42 is aligned with the disk supported by the grooved projections 29 of a pallet 28 and subsequently the disks supported in transfer rod grooves 42 are aligned with the corresponding support grooves in the cassette 40 positioned in the load lock 16.

If necessary, it would be possible to further isolate the adjoining workstations 30 from one another by a gas shower positioned between work stations. A delivery conduit mounted at the inside of the top wall of the modular process unit 8 can release a small amount of an inert gas through a narrow slotted opening or the equivalent to introduce a sheet of isolating gas atmosphere. The isolating gas moves from the slotted outlet to the turbomolecular vacuum pump at the bottom of the modular process unit 8 at a near supersonic velocity to not only enhance isolation between adjoining work stations, but also to purge the surfaces of disks indexing between the adjoining work stations.

The section view of FIG. 8 shows one of the process stations 30 at which a disk substrate 22 supported on a pallet 28 moves between sputtering targets 48. Coaxial flanged extension tubes 49 are mounted at openings in the modular process vessel 8. The sputtering station units include a flanged plate 50 to which is mounted a tubular enclosure element 51, a gas supply tube 52 and the power supply connection 53 leading to the sputtering target 48. A tube 54 telescoped over the tubular enclosure element 51 completes the process station enclosure wherein gas delivered through the tube 52 maintains a desired atmosphere. The tube 54 presents a flange 55 at the distal end that defines a circular opening of approximately the same diameter as the circular disk substrate workpiece 22. The pallet 28 and disk substrate workpiece 22 are indexed to place the workpiece in alignment with the circular openings in flanges 55 for the sputter coating of both sides simultaneously. The work piece and the supporting pallet are moved through the slotted opening or gap 56 between the tube flanges 55 to effect movement into and out of the sputter process station 30. The process gas is supplied through the tube 52 to maintain the atmosphere of a desired composition within the chamber defined by the flange plate 50 and tubular elements 51, 54. The slotted opening 56 between the flanges 55 provides sufficient restriction to isolate the process chamber from adjoining process chambers within the near vacuum envelope. The pressure of the process gas atmosphere within the process chamber is maintained at 10 to 40 microns Hg while the continuously pumped down vacuum envelope pressure approaches 1 micron Hg.

In operation the terminal housings 4, 6 and the intervening modular process units 8 (with four processing stations 30 provided in each unit as shown) afford a single evacuated chamber or vacuum envelope that surrounds the single inline workpiece transport assembly and isolates the process stations 30 from one another. The processing or work stations include two units which are aligned and mounted on opposite side walls of the modular process unit 8 to provide process chambers separated by a slit or slotted opening 56 through which the workpiece 22 and pallet 28 move to index the workpiece into and out of the sequence of work stations. The vacuum envelope defined by the space enclosed by the process modules and the terminal housing units is maintained at a near vacuum by the turbomolecular vacuum pumps 18 that form a part of each modular process unit 8 to achieve a vacuum approaching one micron of Hg. The slotted opening 56 associated with the workstations is sufficient to restrict the depletion of process gases supplied to the process chamber 58 and maintain a desired localized atmosphere of 10 to 40 microns Hg pressure without further control devices while effectively isolating adjoining work stations from one another.

The system is essentially valveless with a single chain conveyer used to move parts 22 along a linear path. Thus there is no requirement that the parts in process be moved from one conveying device to another. The only valves used in the system are those associated with the load lock stations 10, 16 where workpieces are loaded into the system and removed from the system at the opposite end of the linear path. Parts are loaded and unloaded at right angles to the linear processing path that functions within the single uninterrupted vacuum envelope.

A wide variety of process steps may be used with the multiple station availability. Multiple sputtering operations may be undertaken and also presputtering and post sputtering operations. Also to optimize system effectiveness the same operations may be performed at successive stations. If for example, one sputter operation requires 80 seconds of process time and two other companion operations require 20 seconds each, the output of the system would be enhanced by a factor of four by having the 80 second operation broken down into 20 second processes at four successive stations. The system would then not be constrained by the one excessively long process time.

While the invention has been particularly shown and described with reference to a preferred embodiment, it will be understood by those skilled in the art that various changes in form and details may be made therein without departing from the spirit and scope of the invention.

What is claimed is:

1. A sputter deposition system for applying a plurality of coatings to a rigid disk substrate comprising:
    a single evacuated chamber within which a low, near vacuum pressure is maintained, said evacuated chamber having a pair of terminal end units comprising side entry load and unload lock stations;
    disk transport means for moving disks through said evacuated chamber;
    a plurality of process stations each extending within said evacuated chamber in a linear inline configuration on an axis generally perpendicular to the side entry load and unload stations to apply a sputtered coating to both sides of a disk positioned on said transport means at said process station;
    each process station including first and second process chambers which confront one another adjacent said transport means to define a slotted opening therebetween through which a disk is moved into and out of said process station by said transport means, said first and second process chambers being continuously open to said evacuated chamber through said slotted opening; and
    a process gas supply means connected to said first and second process chambers for maintaining a selected process gas atmosphere in said process chambers at a pressure higher than the near vacuum pressure within the surrounding evacuated chamber.

2. The sputter deposition system of claim 1 wherein said processing stations are positioned at equally spaced locations along said transport means.

3. The sputter deposition system of claim 2 wherein said evacuated chamber includes a pair of terminal end units and at least one modular process unit positioned between said terminal end units and on which said processing stations are supported.

4. The sputter deposition system of claim 3 wherein each modular process unit includes a vacuum pump means for maintaining said low, near vacuum pressure within said evacuated chamber.

5. The sputter deposition system of claim 4 wherein said pump means comprises a turbomolecular pump.

6. The sputter deposition system of claim 3 including a plurality of modular process units and wherein each of said first and second process chambers are readily removable as an assembly from the modular process unit without disassembly of said transport means or said modular process unit.

7. The sputter deposition system of claim 6 wherein said system applies plural coatings to said disks which require varying process times and the coating requiring the longest process time is applied at a plurality of consecutive process stations whereby the process times at the various stations are more nearly equalized to enhance throughput of the system.

8. A vacuum deposition device including a plurality of consecutive processing stations comprising:
    an evacuated chamber within which a low, near vacuum pressure is maintained, said evacuated chamber having a pair of terminal end units comprising side entry load and unload lock stations;
    transport means for moving a rigid disk substrate through said evacuated chamber;
    first and second process chambers each extending within said evacuated chamber and mounted adjacent said transport means in a linear inline configuration on an axis generally perpendicular to the side entry load and unload stations and presenting a slotted opening through which said rigid disk substrate enters and exits said process chamber, said first and second process chambers being continuously open to said evacuated chamber through said slotted opening; and process gas supply means connected to each of said first and second process chambers to maintain a selected process gas atmosphere in said process chambers at higher pressure than the pressure of said evacuated chamber, said consecutive processing stations being mounted in spaced relation within said evacuated chamber whereby the process gas atmosphere of said consecutive processing stations are isolated from each other.

9. The vacuum deposition device of claim 8 wherein said process chambers are releasably connected to said evacuated chamber for removal and replacement independent of any disassembly of said transport means or said evacuated chamber.

10. The vacuum deposition device of claim 9 wherein said evacuated chamber comprises a plurality of modular units to enable the increase or decrease of the number of processing stations and said modular units each include an evacuating means for maintaining said low, near vacuum pressure and means for mounting a plurality of said processing chambers.

11. The vacuum deposition device of claim 10 wherein said transport means comprises a sequence of uniformly spaced workpiece carriers secured to a continuous drive element which indexes said workpiece carriers from one processing station to the next adjoining processing station.

12. The vacuum deposition device of claim 11 wherein said evacuated chamber includes wall portion which define a tunnel through which said transport means extends, said processing stations each comprising a pair of confronting units that extend through aligned openings in said wall portions, are releasably attached to said wall portions and terminate in axially spaced relation to form a slotted opening therebetween.

* * * * *